(12) United States Patent
Micheloni et al.

(10) Patent No.: US 7,031,193 B2
(45) Date of Patent: Apr. 18, 2006

(54) METHOD AND DEVICE FOR PROGRAMMING AN ELECTRICALLY PROGRAMMABLE NON-VOLATILE SEMICONDUCTOR MEMORY

(75) Inventors: Rino Micheloni, Turate (IT); Roberto Ravasio, Carvico (IT); Salvatrice Scommegna, Cornate d'Adda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 20 days.

(21) Appl. No.: 10/729,875

(22) Filed: Dec. 5, 2003

(65) Prior Publication Data

US 2004/0170062 A1    Sep. 2, 2004

(30) Foreign Application Priority Data

Dec. 5, 2002    (IT) .......................... MI2002A2569

(51) Int. Cl.
 *G11C 16/06*    (2006.01)
(52) U.S. Cl. .............................. 365/185.22; 365/185.03
(58) Field of Classification Search ....... 365/185.03 X, 365/185.19, 185.22 O
See application file for complete search history.

(56) References Cited

U.S. PATENT DOCUMENTS 5,894,436 A * 4/1999 Ohkawa et al. ........ 365/185.03
6,426,892 B1 * 7/2002 Shibata et al. ......... 365/185.03
6,438,665 B1 * 8/2002 Norman ...................... 711/159

* cited by examiner

*Primary Examiner*—VanThu Nguyen
(74) *Attorney, Agent, or Firm*—Lisa K. Jorgenson; Jose Gutman; Fleit, Kain, Gibbons, Gutman, Bongini & Bianco P.L.

(57) ABSTRACT

A device and method for programming an electrically programmable memory accesses a group of memory cells (MC1–MCk) of the memory to ascertain a programming state thereof (401,407;503,509a,513a); applies a programming pulse to those memory cells in the group whose programming state is not ascertained to correspond to a desired programming state (405;507a,509c,513c); and repeats the steps of accessing and applying for the memory cells in the group whose programming state is not ascertained (411;509b,513b). After the programming state of a prescribed number of memory cells in the group has been ascertained, the memory cells in the group are accessed again and the programming state of the memory cells whose programming state was previously ascertained is re-ascertained (413,415;515). At least one additional programming pulse is applied to those memory cells in the group whose programming state is not re-ascertained (405;507a,509c, 513c). The method guarantees that the programming state of the memory cells is ascertained in conditions that closely resembles, or are substantially identical, to the conditions in which the memory cells will be accessed in a standard read.

19 Claims, 7 Drawing Sheets

METHOD AND DEVICE FOR PROGRAMMING AN ELECTRICALLY PROGRAMMABLE NON-VOLATILE SEMICONDUCTOR MEMORY

CROSS-REFERENCE TO RELATED APPLICATION

This application is based upon and claims priority from prior Italian Patent Application No. MI2002A002569, filed on Dec. 5, 2002, the entire disclosure of which is herein incorporated by reference.

BACKGROUND OF THE INVENTION

1. Field of the Invention

The present invention generally relates to the field of semiconductor memories, and particularly to electrically programmable non-volatile memories such as, for example, EPROMs, EEPROMs and Flash memories. Specifically, the invention concerns a method and device for programming an electrically programmable non-volatile memory.

2. Description of the Related Art

Non-volatile, electrically programmable semiconductor memories have memory cells formed by MOS transistors, whose threshold voltage can be varied electrically to store the desired information.

The number of different values that the threshold voltage of a memory cell may take depends on the number of bits that the memory cell is intended to store. For example, in two-level memories having memory cells intended to store only one bit each, the threshold voltage of each memory cell can take one of two different values, which are associated with the two opposite binary logic states ("1" and "0"). In multi-level memories, whose memory cells are intended to store more than one bit, the number of different threshold voltage values is equal to $2^n$, where n identifies the number of bits stored in each memory cell. Multi-level memories are also known in which n bits are stored in k memory cells, where k<n and n/k is a non-integer number; in this case, the number of different values that the memory cell threshold voltage may take is higher than two, but not equal to a power of two.

Programming a memory cell means setting the memory cell threshold voltage to the desired value, starting from a memory cell erased condition in which the threshold voltage value is equal to or lower than the lowest of the prescribed values. Typically, in order to increase the memory cell threshold voltage, electrons are injected into a memory cell floating gate of, e.g., polysilicon, or into a memory cell charge trapping element (typically, a layer of silicon nitride); the charge present in the floating gate or charge trapping element affects the formation of a conductive channel when a gate voltage is applied to a memory cell control gate.

Electrons are for example injected into the floating gate or charge trapping element by means of the channel hot-electron injection mechanism, which is triggered by applying suitable programming voltages to the memory cell terminals.

The data stored in the memory cell are retrieved by accessing the memory cell in read conditions. Prescribed read voltages are applied to the memory cell terminals, and the current sunk by the memory cell is sensed. The higher the memory cell threshold voltage, the lower the current sunk by the memory cell. The data stored in the memory cell are thus determined by comparing the sensed current to a prescribed reference current (a plurality of reference currents in the case of a multi-level memory).

Conventional programming algorithms call for applying to the memory cell a sequence of programming pulses, each programming pulse providing for applying to the memory cell terminals the proper programming voltages for a prescribed, relatively short time. Each programming pulse determines a slight increase in the memory cell threshold voltage. After each programming pulse, the memory cell threshold voltage is checked (verified) to assess whether the memory cell has been programmed (program verify phase). In order to verify the threshold voltage value, the memory cell is accessed in reading. Typically, in the program verify phase the conditions in which the programming state of the memory cell is ascertained are deliberately made more critical compared to the standard memory cell read access. This means that a memory cell that would be detected as programmed in the standard read conditions may be detected as non-programmed in the program verify conditions, if the memory cell threshold voltage is not adequately high. This assures that the memory cell is programmed with a prescribed margin. Unfortunately, the actual conditions in which a programmed memory cell is normally read may depart from the program verify conditions to such an extent that the programmed memory cell may be read as non-programmed even if it passed the program verify test during the programming phase.

Therefore a need exists to overcome the problems discussed above.

SUMMARY OF THE INVENTION

According to preferred embodiments of the present invention a new device and programming method overcome the problems discussed above.

According to an aspect of the present invention, the method comprises:

It has therefore been an object of the present invention to provide a new programming method allowing to overcome the problem discussed above.

According to an aspect of the present invention, a programming method comprises:

accessing a group of memory cells of the memory to ascertain a programming state thereof;

applying a programming pulse to those memory cells in the group whose programming state is not ascertained to correspond to a desired programming state; and repeating the steps of accessing and applying for the memory cells in the group whose programming state is not ascertained to correspond to a desired programming state.

After the programming state of a prescribed number of memory cells in the group has been ascertained to correspond to a desired programming state, the memory cells in the group are accessed again and the programming state of the memory cells whose programming state was previously ascertained to correspond to a desired programming state is re-ascertained.

At least one additional programming pulse is applied to those memory cells in the group whose programming state is not re-ascertained to correspond to a desired programming state.

According to an aspect of the present invention, a device comprises a programming circuit for programming memory cells of an electrically programmable memory, the programming circuit comprises:

a circuit for applying programming pulses to groups of memory cells;

a circuit for accessing the memory cells in the group and ascertaining a programming state thereof;

a control circuit for controlling the circuit for applying programming pulses so that programming pulses are repeatedly applied to the memory cells in the group until the programming state thereof is not ascertained to correspond to a desired programming state, wherein the control circuit causes the circuit for accessing and ascertaining to access the memory cells in the group and re-ascertain the programming state of the memory cells whose programming state was previously ascertained to correspond to a desired programming state after the programming state of a prescribed number of memory cells in the group has been ascertained to correspond to a desired programming state, and in that he control circuit causes the circuit for applying programming pulses to apply at least one additional programming pulse to those memory cells in the group whose programming state is not re-ascertained to correspond to a desired programming state.

BRIEF DESCRIPTION OF THE DRAWINGS

The features and advantages of the present invention will be made apparent by the following detailed description of an embodiment thereof, provided merely by way of non-limitative example, which will be made in connection with the attached drawings, wherein.

DESCRIPTION OF THE PREFERRED EMBODIMENTS

Figure 1:
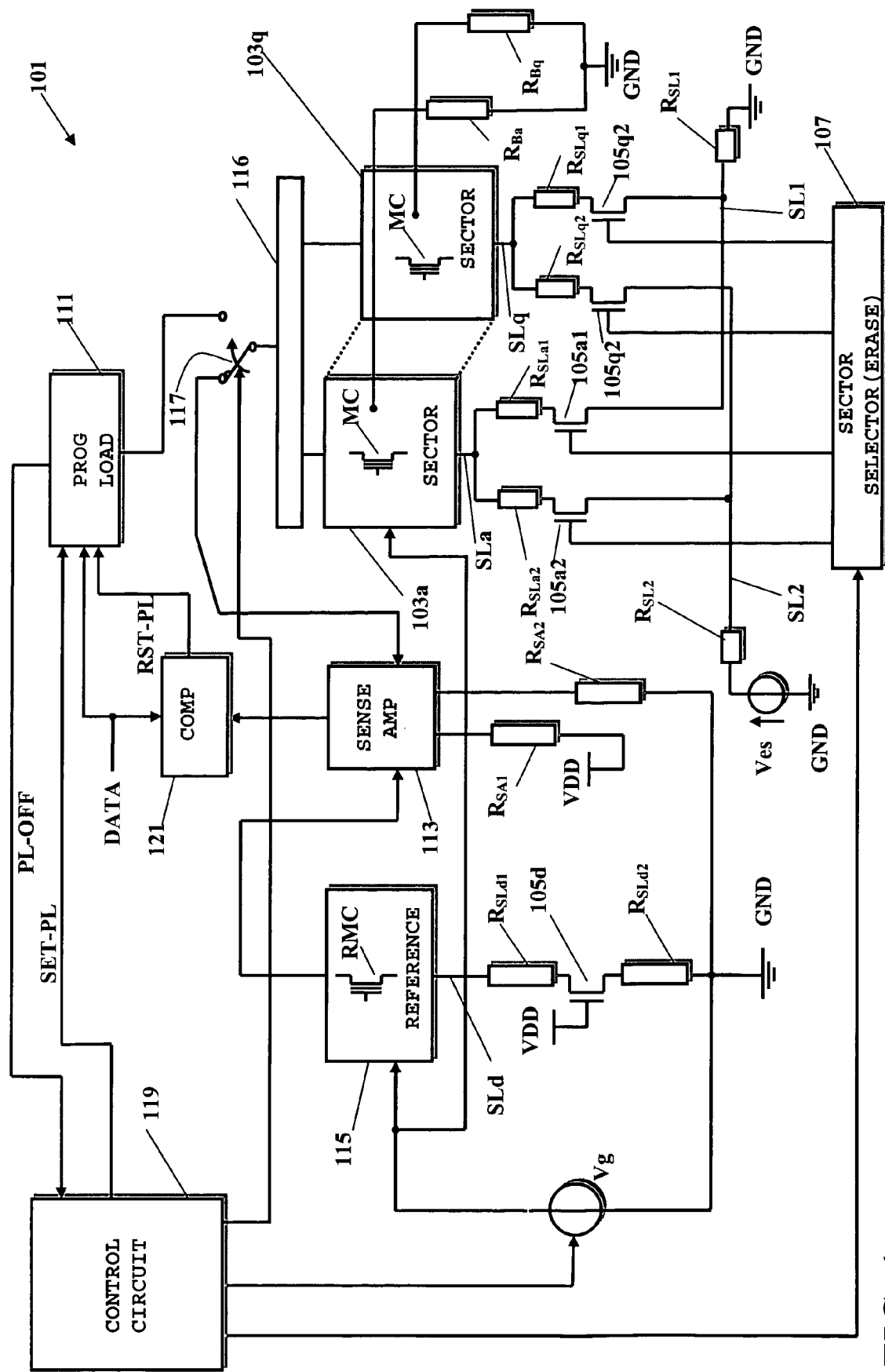
FIG. 1 schematically shows an electrically programmable, non-volatile memory in terms of the main functional blocks.

The Applicant has observed that in electrically programmable memories there are factors that cause the actual conditions in which a programmed memory cell is normally read to depart from the program verify conditions to such an extent that the programmed memory cell may be read as non-programmed even if it passed the program verify test during the programming phase.

These factors include for example parasitic resistances of the supply voltage lines and signal lines, such as the memory cell source resistance, i.e., the resistance unavoidably present in series to the memory cell source electrode. Several contributions add up to originate the source resistance, such as the resistance of the diffusions, the resistance of the metal lines, and the resistance the contacts, just to cite some. Another significant contribution to the source resistance is peculiar of Flash memories. Flash memories are nowadays made up of different memory sectors, each of which can be globally erased independently from the other sectors. A common technique to achieve this erase selectivity calls for separating the sector source lines, i.e., the lines carrying the source potential to the memory cells in the sectors. In this way, the source erase potential (typically, a relatively high positive potential) can be selectively applied only to the memory cells belonging to a desired sector. Source line selection elements, typically pass transistors, need to be placed in series to the sector source lines; these source line selection elements contribute significantly to the overall source resistance.

The source resistance introduces a voltage drop, that depends on the current flowing therethrough. A significant contribution to such a voltage drop is in particular given by the sector source line selection elements, even though they are normally designed to be quite conductive. Within each memory sector, the memory cells are normally accessed simultaneously by groups, also referred to as pages, of, e.g., sixteen, thirty-two or even sixty-four memory cells. When a memory cell that has been submitted to a programming pulse is verified, all the memory cells belonging the same page are actually accessed: the current flowing through the respective source line, and thus through the source line parasitic resistance, depends not only on the programming state of the memory cell being inspected, but also on the programming state of the other memory cells of the same page. If these other memory cells do not change programming state between the program verify phase of the inspected cell and the standard read access thereto, no problems arise: the conditions under which the cell is accessed in standard read are substantially the same as those under which the cell was verified as programmed; on the contrary, if one or more of the other memory cells of the page change their programming state after the memory cell under consideration has been verified as programmed, for example because when the memory cell is verified the other memory cells are not yet programmed and need to be applied further programming pulses, or because they are programmed in a successive programming phase, the different (lower) voltage drop across the source line parasitic resistance, due to the different (lower) current flowing therethrough, changes (increases) the gate-to-source drive voltage experienced by the memory cell under consideration, which may thus be read as non-programmed.

Similar considerations apply for other parasitic resistances, such as for example those associated with the supply voltage lines for the sensing circuits.

The Applicant has observed that this problem affects both two-level and multi-level memories, but in the latter case it is particularly felt, because the threshold voltage values associated with the different binary logic states are relatively close to each other. A relatively slight difference in the memory cell read conditions, e.g. a slightly higher gate-to-source drive voltage, may cause errors in the detected programming state.

Referring to the drawings, and particularly to FIG. 1, an electrically programmable, non-volatile semiconductor memory is schematically shown in terms of the main functional blocks. In particular, in the exemplary and non-limitative embodiment of the invention herein discussed, the memory, globally identified as 101, is a Flash memory.

The memory 101 comprises a plurality of memory sectors 103a, . . . , 103q. Each memory sector includes a two-dimensional array of memory cells MC, conventionally arranged by rows (word lines) and columns (bit lines). The memory cells MC are for example floating-gate MOS transistors, being intended that any other electrically-programmable non-volatile memory cell structure may as well be used. The number of memory sectors, the number of memory cells in each memory sector, the number of rows and columns by which the memory cells in each sector are arranged depend on several factors, such as the overall memory size and the application for which the memory is designed; in any case, these parameters are not critical for the present invention.

The memory sectors 103a, . . . , 103q comprise conventional row and column selection circuits (hereinafter referred to as word line selector and bit line selector, respectively), not shown in detail in FIG. 1 for the sake of clarity of the drawing, for selecting the memory sector rows and columns.

The memory cells MC may be intended to store one bit (two-level memory) or more bits (multi-level memory); in the former case, the memory cell threshold voltage can take either one of two different values, the lower value being conventionally associated with the "1" logic state, and the higher value being associated with the "0" state. In the case of a multi-level memory, the memory cell threshold voltage can take any one of a plurality of different values, e.g., four different values for memory cells capable of storing two bits each; the first, lowest value is conventionally associated with the "11" state, the second value is associated with the "10" state, the third value is associated with the "01" state and the highest value is associated with the "00" state. Opposite conventions can of course be adopted. More generally, in a multi-level memory the number of different values that the memory cell threshold voltage can take may be equal to a power of two, in which case the memory cell store n bits, or the number of such different values may be any integer different from a power of two, in which case n bits are stored in a group of k memory cells, with k<n.

Each memory sector 103a, . . . , 103q has an independent source line SLa, . . . , SLq, supplying a source potential to the memory cells MC of that memory sector. Source line selectors 105a1, 105a2, . . . , 105q1, 105q2 are associated with each source line SLa, . . . , SLq. The source line selectors, in the exemplary embodiment shown formed by pass transistors, e.g. N-channel MOSFETs, are controlled by an erase sector selection circuit 107, and allow selectively connecting the source lines SLa, . . . , SLq of the memory sectors to a first common source line SL1, connected to a reference voltage GND (ground), or to a second common source line SL2, connected to an output of a charge pump generating an erase source voltage Ves, for example a relatively high positive voltage. A memory control circuit 119 controls the erase sector selection circuit 107 which, depending on the operation to be carried out, selectively turns the source line selectors 105a1, 105a2, . . . , 105q1, 105q2 on and off, so as to connect the source lines SLa, . . . , SLq to the common source line SL1 or SL2. In particular, when a given memory sector is accessed in read or program, all the sector source lines SLa, . . . , SLq are connected to the common source line SL1, and thus to ground; on the contrary, when a given memory sector is accessed in erase, the respective sector source line is connected to the common source line SL2, and thus to the erase source voltage, while all the remaining sector source lines are connected to the common source line SL1, and thus to ground.

Associated with the memory sectors 103a, . . . , 103q are a program load circuit 111, a sense amplifier circuit 113 and a set 115 of reference memory cells RMC. A conventional sector selection decoding circuitry 116 enables connecting the program load circuit and/or the sense amplifier circuit, depending on the operation to be conducted, to the selected memory sector. The reference memory cells RMC are structurally identical to the memory cells MC, and are programmed in a predetermined state or states. The reference memory cells RMC generate a reference current or currents, exploited by the sense amplifier circuit 113 for discriminating a programming state of a memory cell being sensed. The set 115 of reference memory cells RMC may include a small array of memory cells structurally identical to the memory cells MC, within which some memory cells are programmed to prescribed states and act as reference memory cells RMC; in particular, in the exemplary case of a four-level memory, three reference memory cells are necessary for the standard read operation, three reference memory cells are necessary for the program verify operation, and one reference memory cell is necessary for the erase verify operation. For reasons of electrical matching, an element 105d emulating the source line selectors 105a1, 105a2, . . . , 105q1, 105q2 is provided along a reference memory cell source line SLd.

The bit lines selected by the column selection circuit of the selected memory sector can be selectively connected to the program load circuit 111 or to the sense amplifier circuit 113, depending on the operation to be conducted (read or program). In particular, switch means 117, controlled by the memory control circuit 119, allow connecting the selected memory cell columns to the program load circuit 111 when the memory cells belonging to the selected bit lines are to be programmed, and to the sense amplifier circuit 113 when the memory cells belonging to the selected bit lines are to be read, for conducting either a standard read or a program verify read.

The program load circuit 111 receives control signals from the memory control circuit 119. In particular, the program load circuit 111 receives from the memory control circuit 119 a control signal SET-PL which, when asserted, causes the program load circuit 111 to connect all the selected bit lines of the selected memory sector to the output of a voltage regulator (not shown) providing a program voltage Vpd (FIG. 2A) for the drain electrodes of the memory cells. The program load circuit 111 also receives a data word DATA to be written into selected memory cells of the selected memory sector. The data word DATA defines a write pattern for the selected memory cells.

A comparator circuit 121 receives and compares the data word DATA and an output of the sense amplifier circuit 113 carrying data read from selected memory cells of the selected memory sector during a program verify read access. The comparator circuit 121 generates a plurality of signals, globally indicated in FIG. 1 by RST-PL, which, depending on the outcome of the comparison, are selectively asserted for causing the program load circuit 111 to selectively disconnect some or all of the selected bit lines of the selected memory sector from the output of the program drain voltage regulator, as will be better described later on.

The memory control circuit 119 may for example be implemented by means of a state machine.

Also shown in FIG. 1 in terms of lumped circuit elements are some of the parasitic components present in the circuit, at least some of which are responsible for the problem discussed in the introductory part of this description. In particular, lumped circuit elements $R_{SLa1}, R_{SLa2}, \ldots, R_{SLq1}, R_{SLq2}$ represent parasitic resistances associated with the sector source lines SLa, ..., SLq; lumped circuit elements $R_{SL1}$ and $R_{SL2}$ represent parasitic resistances associated with the common source lines SL1 and SL2, respectively. Lumped circuit elements $R_{SLd1}$ and $R_{SLd2}$ along the reference memory cell source line SLd represents parasitic resistances corresponding for example to those represented by the lumped circuit elements $R_{SLa1}$ and $R_{SL1}$. Lumped circuit elements $R_{SA1}$ and $R_{SA2}$ represent parasitic resistances associated with a sense amplifier circuit voltage supply line and reference voltage line, respectively.

Figure 2A:
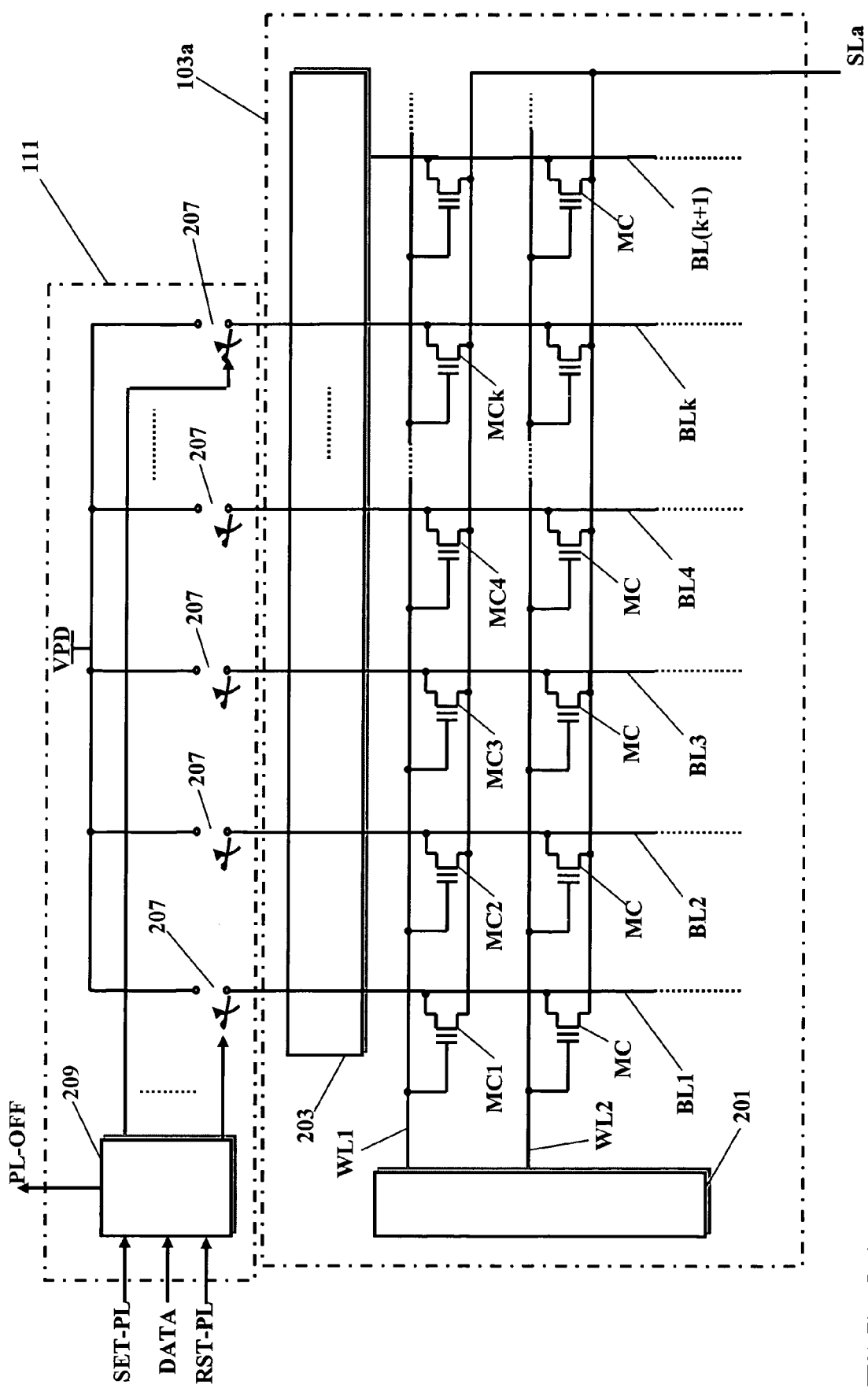
FIG. 2A schematically shows in greater detail a memory sector of the memory of FIG. 1, and the associated program load circuit, in a program operation circuit configuration.

Passing now to FIG. 2A, there is schematically shown in greater detail the structure of one of the memory sectors of the memory, namely the memory sector 103a, with the respective word line selector 201 and bit line selector 203. In particular, FIG. 2A depicts the circuit configuration in the case of a program operation. The word line selector 201 allows selecting one of the plurality of word lines WL1, WL2, ... of the memory cell array of the memory sector 103a. Conventionally, the selection of the word line is carried out decoding a memory address (not shown). The potential of the selected word line, for example the word line WL1, is brought to a prescribed value (word line read voltage or word line program voltage), depending on the operation to be conducted on the memory cells of that word line; the potential of the unselected word lines is typically kept to the reference voltage GND. The bit line selector 203, also operating a decoding of the memory address, allows selecting a group or packet of bit lines (in the shown example, the packet of bit lines BL1–BLk) among the plurality of bit lines BL1–BL(k+1), ... of the memory cell array. A packet of bit lines may for example include sixteen, thirty-two or even sixty-four bit lines or more. The bit lines of a same packet need not be physically adjacent bit lines in the memory cell array of the memory sector: for example, the bit lines of a same packet may be one every eight or sixteen bit lines of the memory cell array. The selected bit lines are connected to the program load circuit 111, while the unselected bit lines are left disconnected (floating); alternatively, the unselected bit lines are kept grounded.

FIG. 2A also shows schematically but in greater detail than FIG. 1 the program load circuit 111. The circuit comprises one program load circuit branch for each bit line of a selected bit line packet. A generic program load circuit branch comprises a switch 207, for example a MOSFET. The switch 207 is connected in series between a program bit line voltage line VPD, generated for example by a voltage regulator, and the respective bit line of the selected packet. A program load control circuit 209 receives the controls signals SET-PL, RST-PL and the write pattern DATA, and accordingly controls the switches 207 of the program load circuit branches.

Figure 2B:
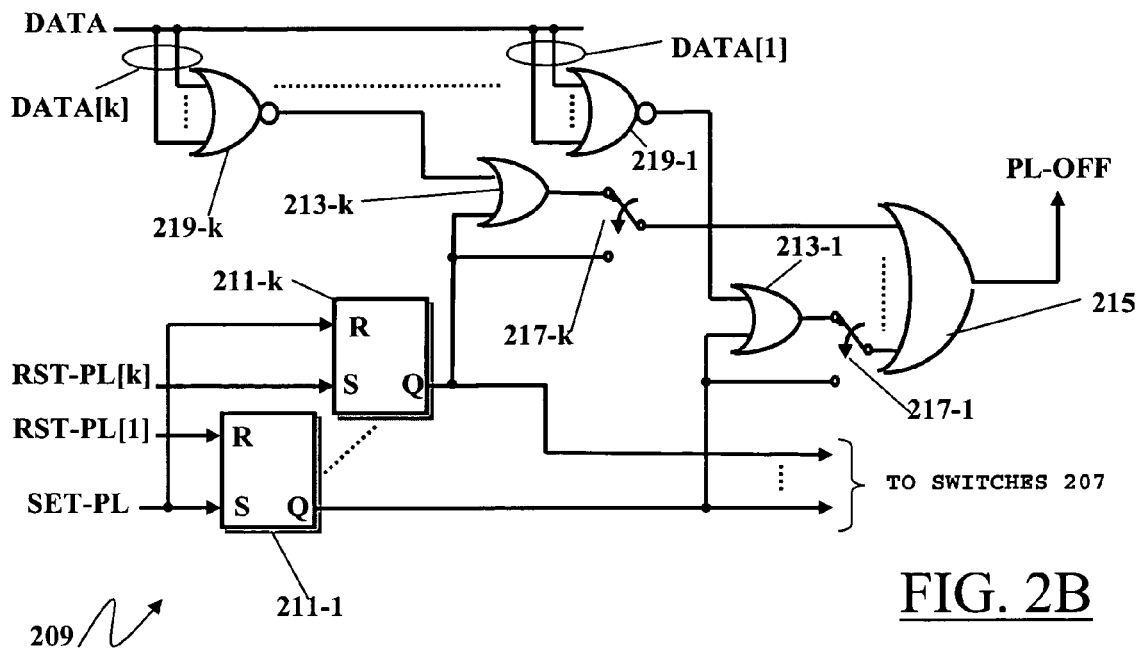
FIG. 2B schematically shows a program load control circuit for controlling the program load circuit.

FIG. 2B shows the structure of the program load control circuit 209 according to an embodiment of the present invention. Each switch 207 is controlled independently by a respective control circuit (only two of the switch control circuits are shown in FIG. 2B, for the sake of simplicity), in the shown example comprising a flip-flop 211-1, ..., 211-k. Each flip-flop 211-1, ..., 211-k receives the control signal SET-PL from the memory control circuit 119, and a respective control signal RST-PL[1], ..., RST-PL[k] part of the control signals RST-PL generated by comparator circuit 121.

The asserted/deasserted state of a generic one of the signals RST-PL[1], ..., RST-PL[k] depends on the result of the comparison, performed by the comparator circuit 121, between the corresponding bit (or group of bits, in the case of a multi-level memory) DATA[1], ..., DATA[k] of the data word DATA to be written into the selected memory cells, and the data bit (or group of bits, in the case of a multi-level memory) read by the sense amplifier circuit from the corresponding memory cell during the program verify phase. In particular, the control signal SET-PL is fed to a set input S of all the flip-flops 211-1, ..., 211-k; the control signal RST-PL[1], ..., RST-PL[k] is fed to a reset input R of the respective flip-flop 211-1, ..., 211-k. An output Q of each flip-flop 211-1, ..., 211-k, which is asserted (logic state "1") when the flip-flop is in the set state, and is deasserted (logic state "0") when the flip-flop is the reset state, controls the open/closed state of the associated program load circuit branch switch 207. When a generic flip-flop 211-1, ..., 211-k is in the set state, the switch 207 of the associated program load circuit branch is closed and a conductive path is established between the program bit line voltage supply line Vpd and the corresponding bit line of the selected packet; in this condition, the memory cells of that bit line receive on their drain terminals the programming voltage. If a flip-flop is in the reset state, the associated switch 207 is open, and the corresponding bit line is left floating (alternatively, the bit line may be grounded); the memory cells of the bit line do not receive on their drain terminal the programming voltage. The state of the switch 207 in the generic program load circuit branch is thus stored in the associated flip-flop 211-1, ..., 211-k.

The output of each flip-flop 211-1, ..., 211-k is additionally fed to a respective OR gate 213-1, ..., 213-k, together with an output of an associated NOR gate 219-1, ..., 219-k fed with a respective portion (including one bit, in the case of a two-level memory, or a group of bits, in the case of a multi-level memory) DATA[1], ..., DATA[k] of the write mask DATA. The outputs of all the OR gates 213-1, ..., 213-k are logically OR-ed together in an OR logic gate 215 to generate a control signal PL-OFF that is fed back to the memory control circuit 119. The signal PL-OFF is used by the memory control circuit 119 to determine the current state of the program load circuit branches. Switches 217-1, ..., 217-k, controlled by the memory control circuit 119, allows bypassing the OR gates 213-1, ..., 213-k, thereby the outputs of the flip-flops 211-1, ..., 211-k are directly connected to the OR gate 215 and the state of the control signal PL-OFF is not affected by the write mask DATA.

Figure 3:
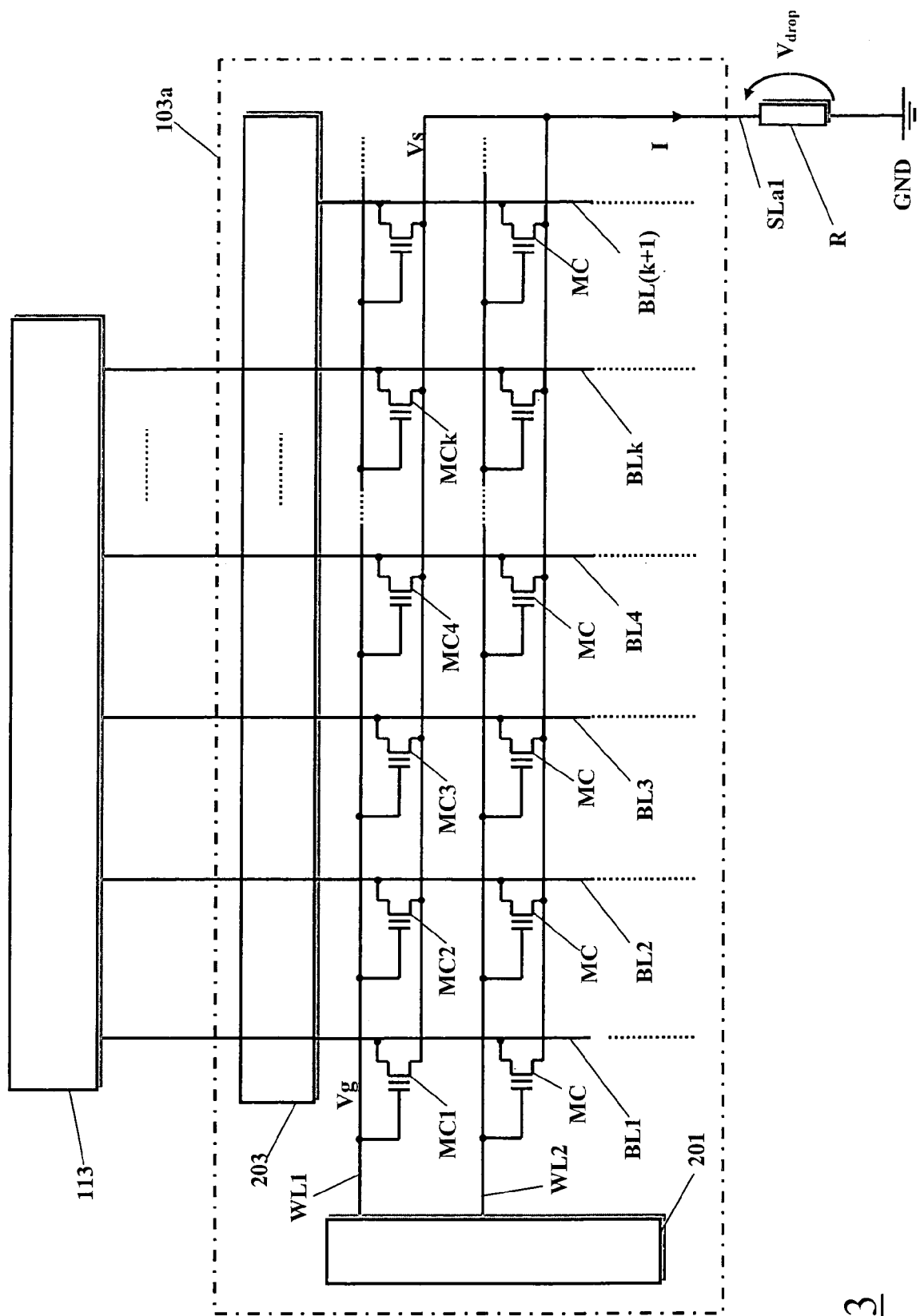
FIG. 3 schematically shows the memory sector of the memory, in a read operation circuit configuration.

FIG. 3 depicts the circuit configuration in the case of a read operation (either a standard read or a program verify read). The bit lines BL1–BLk of the selected packet are electrically connected to the sense amplifier circuit 113, while the bit lines of the non-selected packets are left floating or, alternatively, kept grounded. The sense amplifier circuit 113 senses the current sunk by the memory cells of a selected memory page, and determines the data stored in the memory cells by comparing the sensed currents to a reference current or currents, provided by the reference memory cell RMC or derived therefrom. By memory page there is intended a group of memory cells belonging to a selected word line and to a selected packet of bit lines, such as the memory cells MC1 to MCk in FIGS. 2 and 3.

It can be appreciated that the parasitic resistances $R_{SLa1}, \ldots, R_{SLq1}$ and $R_{SL1}$ cause a source voltage of the memory cells in the respective memory sector to differ from a reference voltage GND present, for example, at a reference voltage pad of the integrated circuit, depending on the current I flowing, i.e., depending on the number of memory cells in the memory sector which are simultaneously conductive: the current I determines in fact a voltage drop Vdrop across the parasitic resistances. The parasitic resistances $R_{SA1}$ and $R_{SA2}$ affect the effective supply voltages of the sense amplifier circuit 113, and again the deviation from supply voltages VDD and GND depends on the number of memory cells in the memory sector which are simultaneously conductive.

Figure 4B:
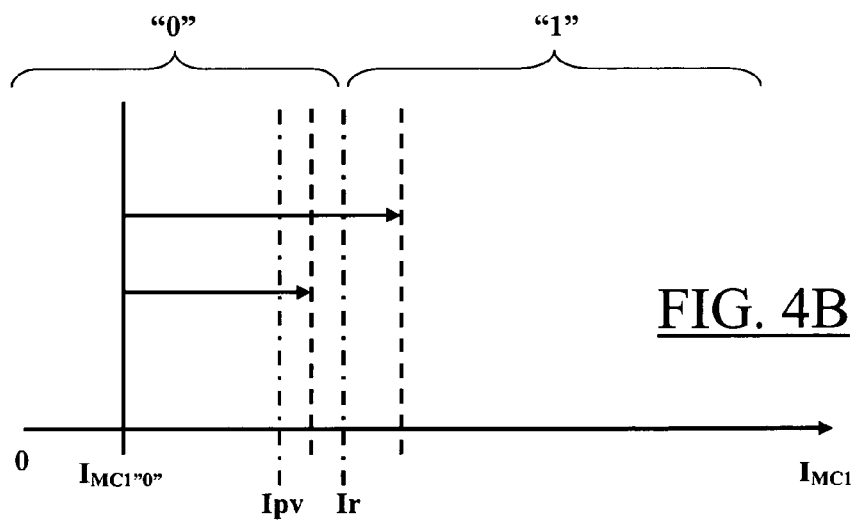
FIG. 4B is a diagram showing the relation between memory cell currents, a standard read reference current and a program verify read reference current, in the simple case of a two-level memory.
Figure 4A:
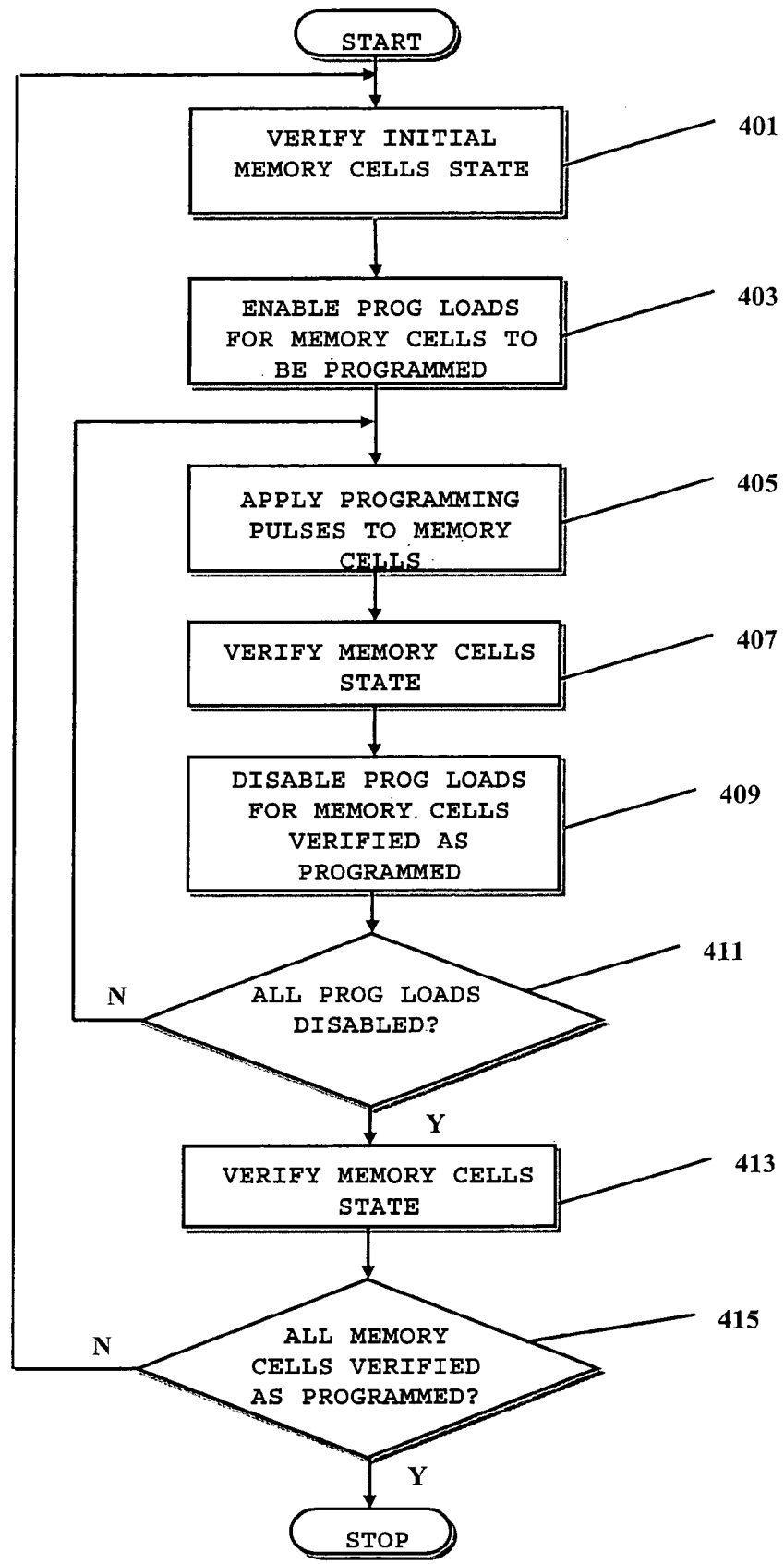
FIG. 4A is a flowchart schematically showing the main steps of a programming method according to an embodiment of the present invention.

FIG. 4A is a flowchart schematically showing in a greatly simplified manner the main steps of a programming operation conducted according to a method in accordance to an embodiment of the present invention.

At the beginning of the programming operation, all the program load circuit branches are enabled (switches 207 all closed); to this purpose, the memory control circuit 119 asserts the control signal SET-PL, causing all the flip-flops 211-1, . . . , 211-k to be put in the set state. The initial state of the memory cells belonging to a selected memory page is then ascertained (block 401). The selected memory page is accessed in program verify conditions, and the data read from the memory cells are compared by the comparator circuit 121 to the data word DATA to be written. If one or more memory cells of the selected memory page are found to be already in the desired programming condition and need not be programmed, the program load circuit branches associated with the bit lines containing such cells are disabled (switch 207 open); the other program load circuit branches, associated with bit lines containing memory cells that need to be programmed, are instead kept enabled (switch 207 closed) (block 403). In order to disable a given program load circuit branch, the comparator circuit 121 asserts the respective control signal among the control signals RST-PL[1]–RST-PL[k], depending on the result of the comparison between the sensed data and the write pattern DATA. It is observed that once a program load circuit branch has been disabled, it cannot be re-enabled during a same programming operation. In other words, the control signal SET-PL is asserted only once, at the beginning of the program operation.

A first program pulse, or a prescribed number of program pulses, is then applied to the memory cells of the memory page; only the memory cells whose program load circuit branches are enabled are submitted to the program pulse (block 405).

After the program pulse has been applied, the memory page is again accessed in program verify conditions, and the data read from the memory cells are compared to the data word DATA (block 407).

If some of the memory cells that were initially non-programmed are now ascertained to be programmed, the respective program load circuit branches are disabled (block 409) by the comparator circuit 121.

A check is then performed to establish whether all the memory cells of the selected memory page are now already programmed; to this purpose (block 411) it is ascertained whether all the program load circuit branches are disabled. The memory control circuit 119 checks the logic state of the control signal PL-OFF. In the negative case (signal PL-OFF deasserted), the flow jumps back to block 405, and additional program pulses are applied only to those memory cells that are not yet programmed; otherwise, all the memory cells of the selected memory page are again accessed in program verify conditions, and their programming state is once more ascertained (block 413). If all the memory cells pass this final program verify step, the programming routine ends. If instead it happens that one or more memory cells do not positively pass this final program verify step, the flow jumps back to the beginning (block 401): all the program load circuit branches are re-enabled (the control signal SET-PL is asserted by the memory control circuit 119), and the whole routine is repeated.

The provision of the final program verify step and, if necessary, the repetition of the programming routine, allow overcoming the problems discussed in the introductory part of this description. Let it for example be assumed that all the memory cells of the selected memory page are initially non-programmed, and that an "all 0" data word DATA is to be written into the selected memory page. Let it also be assumed that after the first program pulse (block 405) the memory cell MC1 is verified to be programmed, while the remaining memory cells MC2 to MCk are detected as not yet programmed. During the program verify step following the application of the first program pulse, all the memory cells MC2–MCk conduct respective currents; a current I (FIG. 3) flowing through the overall parasitic resistance R associated with the source of the memory cell MC1 is thus the sum of all the individual currents conducted by the memory cells MC2–MCk; the current I thus induces a relatively high voltage drop $V_{drop}$ across the parasitic resistance R, which reduces the gate-to-source drive voltage of the memory cell MC1, and thus the current ($I_{MC1"0"}$ in FIG. 4B) sunk by this memory cell. In other words, the memory cell MC1 is verified as programmed in a condition that is characterised by a relatively low gate-to-source drive voltage. Then, after a prescribed number of additional program pulses, all the memory cells MC2–MCk are eventually programmed. If the memory cell MC1 is not verified again, when the memory page is accessed in standard read conditions, the conditions in which the memory cell MC1 is read differ from those in which it was previously verified as programmed: in fact, the memory cells MC2–MCk do not conduct current, or conduct only a small current compared to the current they conducted when they was not yet programmed, and the current I flowing through the parasitic resistance R is approximately zero, or very low. The source potential of the memory cell MC1 is thus different, and in particular lower, than that experienced by this cell during the program verify step; the memory cell MC1 thus experience a greater gate-to-source drive voltage, which causes the memory cell MC1 to conduct a current higher than that conducted during the program verify step: the programming margin of the memory cell MC1 is thus smaller than that expected or, even worse, the greater gate-to-source drive voltage may cause the memory cell MC1 to conduct so high a current that, when accessed in standard read conditions, the memory cell is read as non-programmed: in this case, the program verify test completely fails (FIG. 4B). The same may clearly happen to other cells of the memory page.

The provision of the final program verify step allows instead ascertaining the programming state of all the memory cells of the memory page in a condition that closely resembles, not to say coincide with, the standard read condition. It is thus ensured that all the cells are programmed with the desired margin. In particular, the current $I_{MC1}$ sunk by the memory cell MC1 during the final program verify test is the same as that sunk during a standard read (and the same applies to the other cells of the page).

Figure 5:
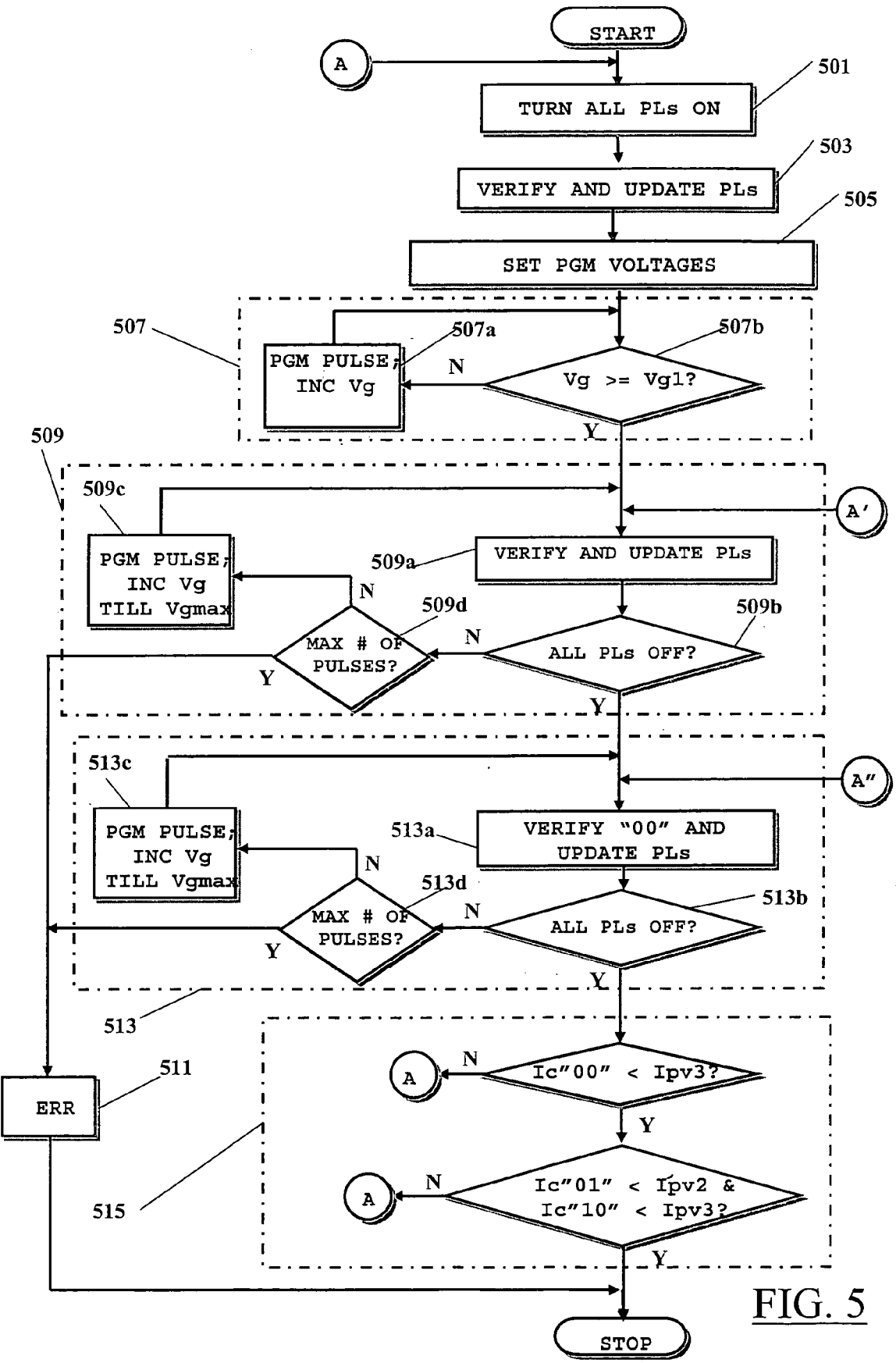
FIG. 5 is flowchart schematically showing in greater detail the main steps of a programming method according to an embodiment of the present invention, particularly adapted to a multi-level memory, and even more particularly a four-level memory.
Figure 6:
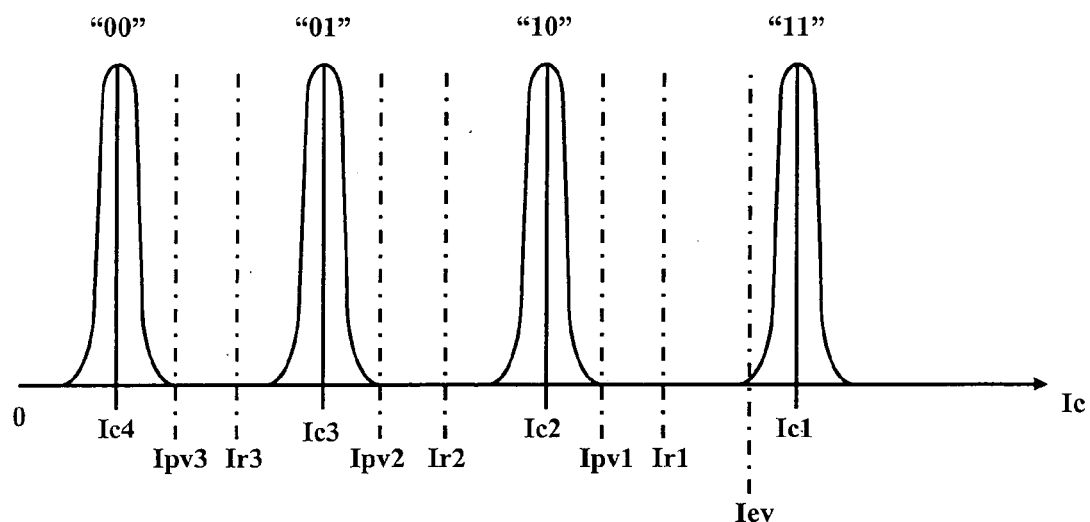
FIG. 6 is a diagram showing the relation between memory cell currents, standard read reference currents and program verify read reference currents, in the case of a four-level memory.

FIG. 5 is a more detailed flowchart illustrating the main steps of a programming operation conducted according to a method in accordance to an embodiment of the present invention, particularly adapted to a multi-level memory, for example a four-level memory. The operation flow will be hereinafter described in conjunction with FIG. 6, showing schematically an arrangement of reference currents adopted for reading the memory cells in standard read and program verify read conditions; these reference currents are for example generated by reference memory cells RMC programmed to predetermined different states. In particular, an horizontal axis Ic represent memory cell current values. Ir1, Ir2 and Ir3 and Ipv1, Ipv2 and Ipv3 represent reference current values used for discriminating the four possible programming states of memory cells in standard read conditions and in program verify read conditions, respectively; Iev represent a reference current value used in erase verify read conditions for ensuring that the memory cells are erased. Ic1, Ic2, Ic3 and Ic4 represent possible values of current sunk by memory cells in each one of the four possible programming states; in particular, Ic1, Ic2, Ic3 and Ic4 are assumed to be the mean values of statistical distributions of currents for memory cells in the different programming states ("11", "10", "01" and "00").

Referring to FIG. 5, all the program load circuit branches are initially enabled (block 501), by asserting the control signal SET-PL.

Figure 7:
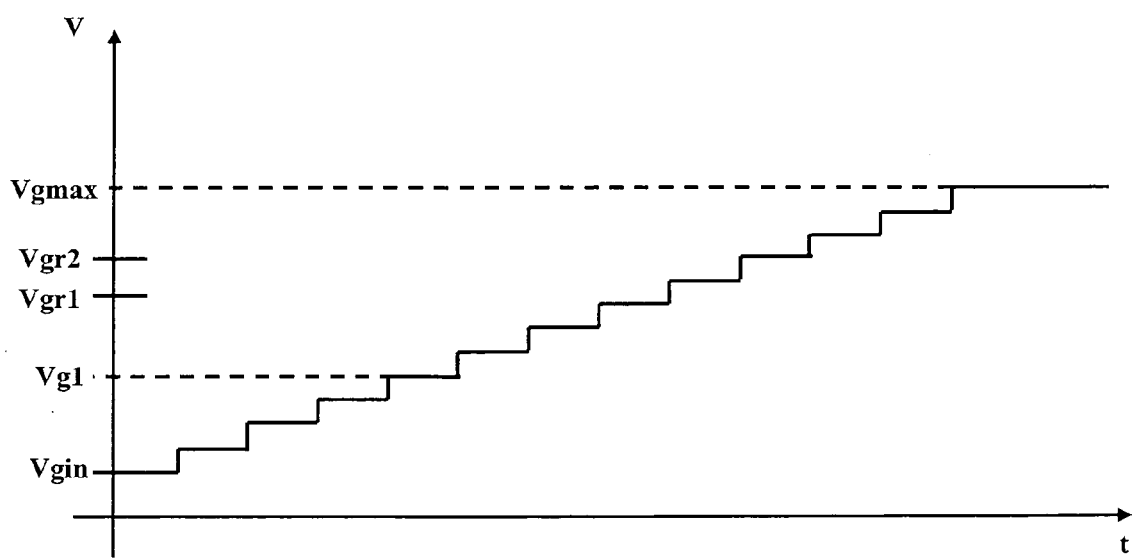
FIG. 7 is a diagram showing memory cell control gate voltages used in the programming method of FIG. 5.

Then (block 503) the memory cells of the selected memory page are accessed in program verify read conditions, for ascertaining their programming state, and the retrieved data are compared by the comparator circuit 121 to the data word DATA to be written into the selected memory cells. In particular, referring to FIG. 6, in an embodiment of the present invention only the memory cells which will have to store a "10" and a "01" are verified at this step. The gate voltage Vg is set equal to the standard read voltage (Vgr1 in FIG. 7, e.g., approximately 5V); the sense amplifier circuit 113 is controlled to compare the memory cell current with the program verify reference currents Ipv1, Ipv2 and Ipv3 (instead of the standard read reference currents Ir1, Ir2 and Ir3). The memory cells are declared to be already in the desired programming state if they will have to store a "11", or if they will have to store a "01" and Ic<Ipv2, or if they will have to store a "10" and Ic<Ipv1.

By selectively asserting the control signals RST-PL, the comparator circuit 121 selectively keeps enabled or disables the program load circuit branches associated with those memory cells of the selected memory page that are intended to store a "11", a "10" or a "01", depending on whether the respective memory cell is to be programmed or, respectively, is declared to be already in the desired programming state. The program load circuit branches associated with memory cells intended to store a "00" are instead keep enabled. In this way, only those memory cells that are not declared to be already in the desired state will be applied program pulses.

The programming voltages are then set up (block 505); in particular, the gate voltage Vg is set equal to an initial voltage (Vgin in FIG. 7), e.g. approximately equal to 1.5V.

A first loop 507 is then entered, providing for applying to the memory cells of the selected memory page a number of program pulses with increasing programming gate voltages Vg (block 507a), until a prescribed programming gate voltage (Vg1 in FIG. 7) is reached, for example approximately 3V (block 507b). For example, at each step of the loop the programming gate voltage is increased by approximately 300 mV. During this first loop, the programming state of the memory cells is not verified after each programming pulse. At each program pulse, the threshold voltage of the memory cells whose program load circuit branches are enabled increases of a relatively well known amount.

At the end of the loop 507, a second loop 509 is entered. At each repetition of the second loop 509, the memory cells are again accessed in program verify read conditions (block 509a), and the respective programming state ascertained, to determine if some cells have already been brought to the desired programming state. In particular, as in the previous program verify step (block 503), only the memory cells intended to store a "10" and a "01" are verified at this step. The gate voltage Vg is set equal to the standard read voltage (Vgr1), and the sense amplifier circuit 113 is controlled to compare the memory cell current with the program verify reference currents Ipv1, Ipv2 and Ipv3. The memory cells are declared to have been brought to the desired programming state if they are intended to store a "01" and Ic<Ipv2, or if they are intended to store a "10" and Ic<Ipv1. The program load circuit branches are accordingly kept enabled or disabled. The program load circuit branches associated with memory cells intended to store a "00" are instead kept enabled. Then, it is ascertained whether all the program load circuit branches associated with cells intended to store a "10" or a "01" are already disabled (block 509b); to this purpose, the memory control circuit 119 keeps the switches 217-1, ..., 217-k turned onto the output of the associated OR gate 213-1, ..., 213-k, and senses the control signal PL-OFF; it is observed that, in this condition, thanks to the provision of the OR gates 213-1, ..., 213-k, the state of the control signal PL-OFF is not affected by the state of the flip-flops 211-1, ..., 211-k associated with memory cells intended to store a "00". In the negative case (the control signal PL-OFF is deasserted, meaning that some of the program load circuit branches associated with memory cells intended to store a "10" or a "01" are still enabled), the programming gate voltage is increased (or, if a maximum programming gate voltage Vgmax has been reached, it is kept to Vgmax) and another program pulse is selectively applied to the memory cells still not programmed (block 509c). Preferably, before applying another programming pulse, it is checked whether, in the repetition of the loop 509, a maximum allowed number of programming pulses is reached (block 509d); if the maximum number of programming pulses has been reached, the loop 509 is exited, an error condition is declared (block 511) and the programming routine stops.

When all the program load circuit branches associated with cells intended to store a "10" or a "01" are found to be disabled (a situation detected by the memory control circuit 119 on the basis of the state of the control signal PL-OFF), a third loop 513 is entered. In this third loop 513, at each repetition, the memory cells intended to store a "00" are accessed in program verify condition. The gate voltage Vg is set equal to a value higher than the standard read voltage (Vgr2 in FIG. 7, e.g., 6V), and the sense amplifier circuit 113 compares the current Ic sunk by the memory cells intended to store a "00" with the reference currents Ipv1, Ipv2 and Ipv3. If, for any given cell under verify intended to store a "00", it results to be Ic<Ipv3, the respective program load circuit branch is disabled (block 513a).

Then, it is ascertained whether all the program load circuit branches result to be disabled (block 513b); for this operation, the switches 217-1, ..., 217-k are turned onto the outputs of the associated flip-flop 211-1, ..., 211-k. In the negative case (some program load circuit branches are still enabled), the programming gate voltage is increased (or, if a maximum programming gate voltage Vgmax has been reached, it is kept to Vgmax) and another program pulse is selectively applied to the memory cells still not programmed (block 513c). As before, prior to applying another programming pulse, it is preferably checked whether, in the repetition of the loop 513, a maximum allowed number of programming pulses has been reached (block 513d): if the maximum number of programming pulses has been reached, the loop 513 is exited, an error condition is declared (block 511) and the programming routine stops.

When all the program load circuit branches are eventually found to be disabled, a final program verify 515 of the memory cells is performed. In particular, the memory cells intended to store a "00" are verified first (block 515a); in this way, the read gate voltage Vg need not be changed (it is kept to Vgr2). If some of these memory cells are found to sink a current higher than Ipv3, the flow jumps back to the beginning (connector A). If all the memory cells intended to store a "00" are found to be correctly programmed, the memory cells intended to store a "01" and a "10" are then verified: the read gate voltage Vg is set equal to the standard read voltage (Vgr1), and the sense amplifier circuit 113 compares the currents sunk by the cells to the reference currents Ipv2, Ipv1 and Ipv3. If it is not found that the current sunk by the cells intended to store a "01" is lower than the reference current Ipv2, and that the current sunk by the cells intended to store a "10" is lower than the reference current Ipv1, the flow jumps back to the beginning (connector A). If instead all the memory cells are re-ascertained to be correctly programmed, the programming routine ends.

Also in this case, the benefits of providing a final program verify step can be readily appreciated.

It is pointed out that it is not strictly necessary that the final program verify test be carried out when the programming state of all the memory cells of the selected memory page has been ascertained. It suffices that the final program verify test is executed after the programming state of a prescribed number of cells in the page has been ascertained, such a prescribed number being sufficiently high to ensure that the conditions under which the programming state of the cells is verified are not significantly different from those under which they will be in a standard read.

In an alternative embodiment of the present invention, if in the final program verify test the programming state of one or more cells is not reascertained, the flow does not jump back to the beginning of the programming routine, but to an intermediate point, for example the point A' or the point A" in FIG. 5, depending on whether, among the memory cells that do not passed the final program verify test, there are memory cells intended to be programmed in the "10", "01" or "00" states. For example, if the only cells that did not pass the final verify test are those intended to be programmed in the "00" state, it is sufficient to jump back at point A". In particular, the point of the flow where to jump back is determined on the basis of the write pattern DATA. In this way, the overall time required for programming the memory cells is reduced.

Figure 8:
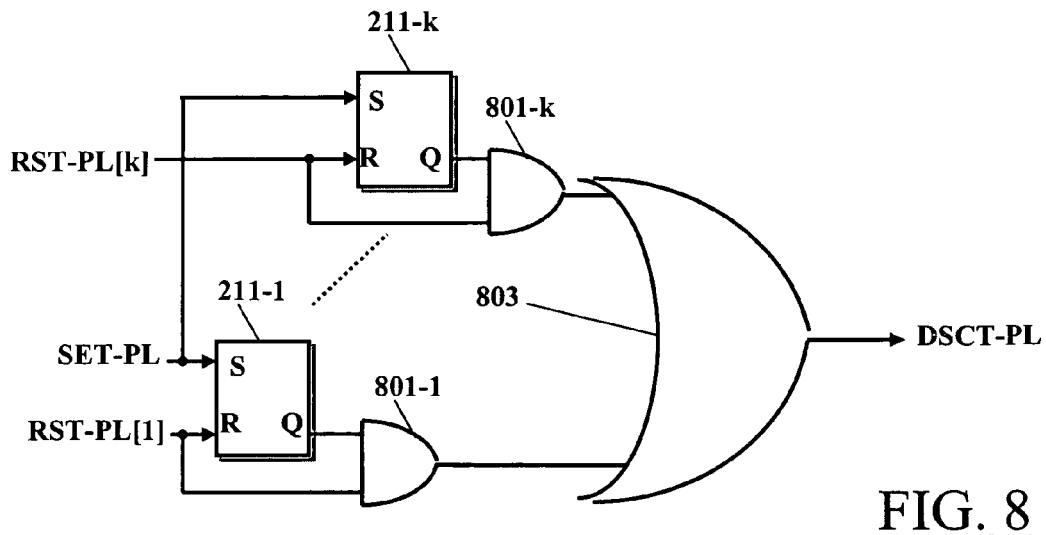
FIG. 8 schematically shows a circuit arrangement for implementing a programming method according to an alternative embodiment of the present invention.

In still another embodiment, when the flow jumps back to, e.g., point A' or point A", the programming gate voltage Vg is not necessarily brought back to the standard entrance value for the loop 509 or 513, but to a possibly different value; in particular, such different value is a programming gate voltage value related to a programming gate voltage value detected during the immediately previous run of the programming routine and at which one or more memory cells were first ascertained as programmed during the program verify steps of block 509a or 513a. FIG. 8 schematically shows a circuit arrangement adapted to implement this functionality. The output Q of each flip-flop 211-1, . . . , 211-k controlling the open/closed state of a respective program load circuit branch switch 207 is fed to a first input of a respective AND gate 801-1, . . . , 801-k; a second input of each AND gate 801-1, . . . , 801-k is fed with the control signal RST-PL[1], . . . , RST-PL[k] feeding the reset input of the respective flip-flop 211-1, . . . , 211-k. The outputs of all the AND gates 801-1, . . . , 801-k feed an OR gate 303. When a program load circuit branch, initially enabled (switch 207 closed) is to be disabled (switch 207 open), the control signal RST-PLi and the flip-flop output are both at the "1" logic level for a given time interval, before the flip-flop content is updated, so that the output of the associated AND gate 801-i is a logic "1" during that time interval; to this purpose, updating of the flip-flops may be conditioned by an enable signal, not shown, generated by the memory control circuit 119, or by the comparator circuit 121, and properly delayed with respect to the control signal RST-PL[1], . . . , RST-PL[k]. An output of the OR gate 303 is thus asserted high whenever at least one program load circuit branch has to be switched from the enabled to the disabled state. The signal DSCT-PL generated by the OR gate 303 can be exploited by the memory control circuit 119 for detecting this situation, and the memory control circuit 119 can thus store the current programming gate voltage value.

The present invention can be applied in general to any kind of electrically programmable semiconductor memory, being it an EPROM, an EEPROM or a Flash memory. An integrated circuit can comprise a programming circuit electrically coupled with at least one electrically programmable semiconductor memory in accordance with a preferred embodiment of the present invention. Additionally, such integrated circuit may comprise a circuit supporting substrate for supporting at least a portion of the programming circuit electrically coupled with the at least one electrically programmable semiconductor memory. These and many other circuit arrangements should be obvious to those of ordinary skill in the art in view of the present discussion.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular, situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

The invention claimed is:

1. A method of programming an electrically programmable memory, the method comprising:
 accessing a group of memory cells of an electrically programmable memory to ascertain a programming state thereof;
 applying a programming pulse to those memory cells in the group whose programming state is not ascertained to correspond to a desired programming state; and
 repeating the steps of accessing and applying for the memory cells in the group whose programming state is not ascertained to correspond to a desired programming state, wherein
  after the programming state of a prescribed number of memory cells in the group has been ascertained to correspond to a desired programming state, accessing again the memory cells in the group and re-ascertaining the programming state of the memory cells whose programming state was previously ascertained to correspond to a desired programming state; and applying at least one additional programming pulse to those memory cells in the group whose programming state is not re-ascertained to correspond to a desired programming state.

2. The method according to claim 1, wherein the electrically programmable memory comprises at least one memory of type of at least one of EPROM, EEPROM, and Flash memory.

3. The method according to claim 1, in which the act of re-ascertaining is performed after the programming state of all the memory cells in the group has been ascertained to correspond to a desired programming state.

4. The method according to claim 1, in which the applying a programming pulse comprises varying, substantially at each programming pulse, a voltage applied to a control electrode of the memory cells of the group, progressively passing from a first voltage to a second voltage.

5. The method according to claim 4, in which the applying at least one additional programming pulse comprises restarting from the voltage applied to a control electrode of the memory cells equal to the first voltage.

6. The method according to claim 4, in which the applying at least one additional programming pulse comprises restarting from a voltage applied to a control electrode of the memory cells intermediate between the first voltage and the second voltage.

7. The method according to claim 6, comprising establishing a programming voltage value for which the programming state of at least one of the memory cells in the group is ascertained first to correspond to a desired programming state; and determining the intermediate voltage on the basis of the established programming voltage value.

8. The method according to claim 4, in which the varying comprises progressively increasing the voltage applied to the control electrode of the memory cells from a lower value to a higher value.

9. The method according to claim 1, further comprising, after the act of applying at least one additional programming pulse, accessing again the memory cells in the group for ascertaining the programming state of the memory cells whose programming state was previously not re-ascertained to correspond to a desired programming state.

10. The method according to claim 9, in which the act of re-ascertaining is performed after the programming state of all the memory cells in the group has been ascertained to correspond to a desired programming state.

11. The method according to claim 9, in which the applying a programming pulse comprises varying, substantially at each programming pulse, a voltage applied to a control electrode of the memory cells of the group, progressively passing from a first voltage to a second voltage.

12. The method according to claim 11, in which the applying at least one additional programming pulse comprises restarting from the voltage applied to a control electrode of the memory cells equal to the first voltage.

13. The method according to claim 11, in which the applying at least one additional programming pulse comprises restarting from a voltage applied to a control electrode of the memory cells intermediate between the first voltage and the second voltage.

14. The method according to claim 13, comprising establishing a programming voltage value for which the programming state of at least one of the memory cells in the group is ascertained first to correspond to a desired programming state, and determining the intermediate voltage on the basis of the established programming voltage value.

15. The method according to claim 11, wherein the varying comprises progressively increasing the voltage applied to the control electrode of the memory cells from a lower value to a higher value.

16. A circuit for programming memory cells of an electrically programmable memory, comprising:

a circuit for applying programming pulses to groups of memory cells of an electrically programmable memory;

a circuit for accessing the memory cells in the group and ascertaining a programming state thereof; and a control circuit for controlling the circuit for applying programming pulses so that programming pulses are repeatedly applied to the memory cells in the group until the programming state thereof is ascertained to correspond to a desired programming state, wherein the control circuit causes the circuit for accessing and ascertaining to access the memory cells in the group and re-ascertain the programming state of the memory cells whose programming state was previously ascertained to correspond to a desired programming state after the programming state of a prescribed number of memory cells in the group has been ascertained to correspond to a desired programming state, and in that the control circuit causes the circuit for applying programming pulses to apply at least one additional programming pulse to those memory cells in the group whose programming state is not re-ascertained to correspond to a desired programming state.

17. The circuit of claim 16, wherein the electrically programmable memory comprises at least one memory of type of at least one of EPROM, EEPROM, and Flash memory.

18. An integrated circuit comprising:

a circuit supporting substrate;

at least one electrically programmable semiconductor memory being at least partially supported by the circuit supporting substrate; and a circuit for programming memory cells of the at least one electrically programmable semiconductor memory, the circuit being electrically coupled with the at least one electrically programmable semiconductor memory and further being at least partially supported by the circuit supporting substrate, the circuit comprising:

a circuit for applying programming pulses to groups of memory cells of the at least one electrically programmable semiconductor memory;

a circuit for accessing the memory cells in the group and ascertaining a programming state thereof; and a control circuit for controlling the circuit for applying programming pulses so that programming pulses are repeatedly applied to the memory cells in the group until the programming state thereof is net ascertained to correspond to a desired programming state, wherein the control circuit causes the circuit for accessing and ascertaining to access the memory cells in the group and re-ascertain the programming state of the memory cells whose programming state was previously ascertained to correspond to a desired pro gramming state after the programming state of a prescribed number of memory cells in the group has been ascertained to correspond to a desired programming state, and in that the control circuit causes the circuit for applying programming pulses to apply at least one additional programming pulse to those memory cells in the group whose programming state is not re-ascertained to correspond to a desired programming state.

19. The integrated circuit of claim 18, wherein the at least one electrically programmable semiconductor memory comprises at least one memory of type of at least one of EPROM, EEPROM, and Flash memory.

* * * * *

UNITED STATES PATENT AND TRADEMARK OFFICE
CERTIFICATE OF CORRECTION

| | | |
|---|---|---|
| PATENT NO. | : 7,031,193 B2 | Page 1 of 1 |
| APPLICATION NO. | : 10/729875 | |
| DATED | : April 18, 2006 | |
| INVENTOR(S) | : Rino Micheloni et al. | |

It is certified that error appears in the above-identified patent and that said Letters Patent is hereby corrected as shown below:

Please make the following changes:

Column 15, line 34, from "state; and" to --state, and--
Column 16, line 61, from "thereof is net ascertained" to --thereof is ascertained--
Column 16, line 67, from "a desired pro" to --a desired pro---

Signed and Sealed this

Eleventh Day of July, 2006

JON W. DUDAS
*Director of the United States Patent and Trademark Office*